United States Patent
Filipiak

(10) Patent No.: US 7,192,855 B2
(45) Date of Patent: Mar. 20, 2007

(54) PECVD NITRIDE FILM

(75) Inventor: Stan Filipiak, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 11/106,970

(22) Filed: Apr. 15, 2005

(65) Prior Publication Data

US 2006/0234434 A1    Oct. 19, 2006

(51) Int. Cl.
*H01L 21/26*    (2006.01)
*H91L 21/42*    (2006.01)

(52) U.S. Cl. ............... 438/513; 438/197; 438/680; 257/E21.17; 257/E21.293

(58) Field of Classification Search .......... 438/513, 438/197, 311, 680, 692, 502, 715, 296, 723, 438/724
See application file for complete search history.

(56) References Cited

U.S. PATENT DOCUMENTS

| | | | | |
|---|---|---|---|---|
| 5,831,283 A | * | 11/1998 | Batey et al. | 257/66 |
| 6,174,810 B1 | * | 1/2001 | Islam et al. | 438/687 |
| 6,255,217 B1 | * | 7/2001 | Agnello et al. | 438/687 |
| 6,444,542 B2 | * | 9/2002 | Moise et al. | 438/448 |
| 6,492,267 B1 | * | 12/2002 | Yin et al. | 438/687 |
| 6,504,235 B2 | | 1/2003 | Schmitz et al. | 257/649 |

* cited by examiner

*Primary Examiner*—David Nhu
(74) *Attorney, Agent, or Firm*—John A. Fortkort; Fortkort & Houston P.C.

(57) ABSTRACT

A method for forming a semiconductor device is provided. In accordance with the method, a substrate (103) is provided, and a dielectric material (123) is formed on the substrate through plasma enhanced chemical vapor deposition (PECVD). The PECVD is conducted at a temperature of greater than 300° C., and utilizes an atmosphere comprising nitrogen, silane, ammonia, and helium.

23 Claims, 6 Drawing Sheets

PECVD NITRIDE FILM

FIELD OF THE DISCLOSURE

The present disclosure relates generally to methods for making semiconductor devices, and more particularly to methods for making dielectric materials for semiconductor devices through PECVD.

BACKGROUND OF THE DISCLOSURE

High density integrated circuits typically comprise numerous electrical devices and conductors that are formed on or in multiple layers of conductor and semiconductor materials. The conductor and semiconductor materials are deposited and patterned in sequence on a substrate. A dielectric material, such as silicon nitride, is typically positioned between the individual devices so as to electrically isolate the devices from one another. In particular, intermediate insulating layers, known as interlevel dielectrics (ILDs), are typically interposed between the conducting layers in a circuit so as to electrically isolate the device components formed on adjacent layers. The insulating layers prevent electrical shorts and preserve device integrity.

One common method for forming ILDs is through chemical vapor deposition (CVD). Conventional thermal CVD processes supply reactive gases to the substrate surface, where heat-induced chemical reactions take place to produce a desired film. Since the high temperatures at which some thermal CVD processes operate can damage device structures previously formed on the substrate, CVD techniques have been developed that operate at lower temperatures. One example of such a technique is plasma enhanced chemical vapor deposition (PECVD).

PECVD techniques promote the excitation and/or disassociation of reactant gases through the application of radio frequency (RF) energy to a reaction zone near the substrate surface, thereby creating a plasma which contains some highly reactive species. The high reactivity of the released species reduces the energy required for a chemical reaction to take place, and thus lowers the required temperature for such PECVD processes.

Despite the many advantages of PECVD, the films produced by conventional PECVD processes do not always have the physical properties desired for certain applications. For example, in some applications, it would be desirable to increase the compressive stress levels in silicon nitride ILD films in CMOS transistors, since doing so would increase the speed of the transistor. However, in practice, it is difficult to increase the compressive stress in such films beyond about 300–500 MPa. Moreover, even at these stress levels, significant film uniformity issues arise.

There is thus a need in the art for a method for making films, and in particular, silicon nitride films of the type suitable for ILD applications, that exhibit increased compressive stress and improved film uniformity. There is further a need in the art for high stress ILD films made by such a process, and for CMOS devices that include such ILD films. These and other needs are met by the devices and methodologies described herein.

DETAILED DESCRIPTION

In one aspect, a method for forming a nitride layer is provided. In accordance with the method, a substrate is provided, and a nitride layer is formed on the substrate through plasma enhanced chemical vapor deposition (PECVD). The PECVD is conducted at a temperature greater than 300° C., and utilizes an atmosphere comprising nitrogen, silane, ammonia, and helium.

In another aspect, a semiconductor device is provided which comprises (a) first and second conductive layers, and (b) a layer of silicon nitride disposed between said first and second conductive layers. The layer of silicon nitride has a compressive stress of at least about 1 GPa, preferably at least about 1.7 GPa, more preferably at least about 2 GPa, and most preferably, at least about 2.3 GPa.

These and other aspects of the present disclosure are described in greater detail below.

It has now been found that the above noted needs may be met through suitable modifications to the chemistry and variables of the PECVD process. In particular, it has been found that high compressive stress silicon nitride films may be formed through the use of PECVD by the addition of helium to the deposition chemistry, and by maintaining, within suitable ranges, the pressure, RF power, and spacing between the substrate and upper electrode. Films may be made by this process that exhibit compressive stresses of greater than–1.5 GPa. Moreover, the resulting process may provide acceptable deposition rates (e.g., deposition rates of about 17Å/sec), good Fourier Transform—Infrared (FT-IR) bonding profiles, exceptional film stability and uniformity. In addition, transistors that incorporate this film as an ILD layer may exhibit increased speed.

Figure 2:
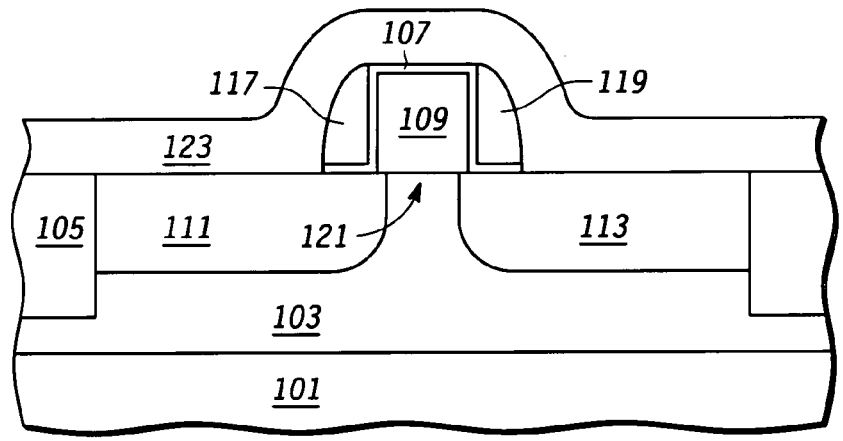
FIG. 2 is an illustration of a step in a manufacturing process for devices that utilize an ILD of the type described herein.
Figure 3:
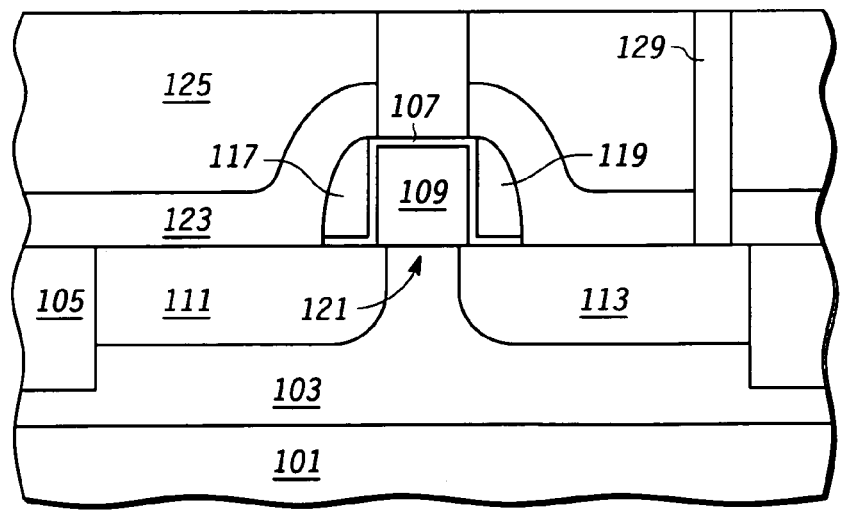
FIG. 3 is an illustration of a step in a manufacturing process for devices that utilize an ILD of the type described herein.

The ILD films described herein may be better understood in the context of the semiconductor fabrication processes that utilize these films. Some of the steps of one non-limiting example of such a process are illustrated in FIGS. 1–3.

Figure 1:
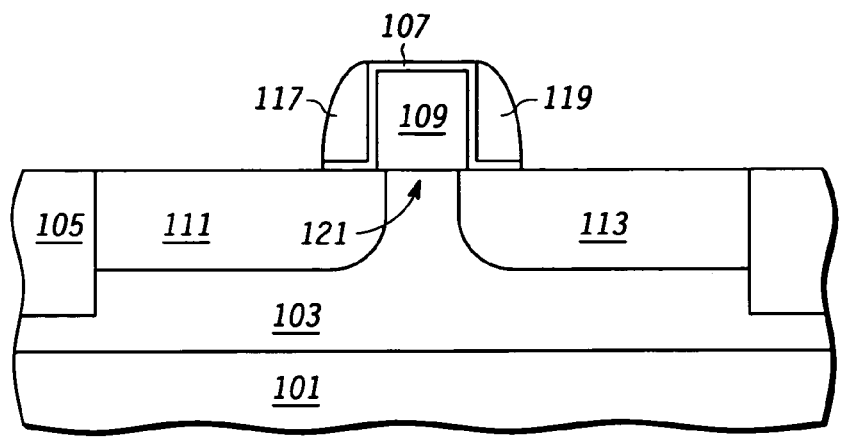
FIG. 1 is an illustration of a step in a manufacturing process for devices that utilize an ILD of the type described herein.

With reference to FIG. 1, a (typically monocrystalline) substrate 101 is provided which may be, for example, a bulk wafer, but is preferably an SOI substrate having either a <100>or a <110> crystal orientation. A device layer 103 is epitaxially grown on the substrate. A plurality of field isolation regions 105 are formed in the device layer 103 to isolate wells of different conductivity types, and to isolate adjacent transistors from each other. The field isolation regions 105 may be, for example, shallow trench isolation (STI) regions that may be formed by etching a trench into the device layer 103, and then filling the trench with an oxide or other suitable dielectric such as $Si_3N_4$.

A gate dielectric layer 107 is then formed on the surface of the device layer 103. The gate dielectric layer 107 may comprise, for example, a nitrided oxide layer which will typically be formed to a thickness of between 5 and 30 Å. The gate dielectric layer 107 may also comprise a metal oxide such as $HfO_2$ or $ZrO_2$.

A gate electrode 109 is formed on the gate dielectric layer 107. The gate electrode 109 typically has a thickness within the range of about 750 Å to about 3,500 Å. The gate electrode 109 may be formed by blanket deposition of a layer of Si, SiGe or polysilicon, which is then patterned utilizing photolithographic techniques as are known to the art. In a typical embodiment, the gate electrode 109 has a length of approximately 60 nm.

The device layer 103 is provided with source 111 and drain 113 regions. As shown in FIG. 1, spacer structures 117, 119 are formed on opposing sides of the gate electrode 109. The spacer structures 117, 119 cover the sides of the gate electrode 109, and also cover a portion of the surface of the device layer 103 (and more particularly, source 111 and drain 113 regions) adjacent to the gate electrode 109. The formation of spacer structures is well known in the art, and typically involves deposition of one or more layers of the spacer materials, followed by an etch-back using suitable photolithographic techniques. A channel region 121 is defined between the inner edges of source 111 and drain 113 regions.

Referring to FIG. 2, an ILD layer 123 is then deposited over the structure using PECVD. As shown in FIG. 3, this is followed by the formation of another ILD layer 125, which is also deposited by PECVD. The ILD layer 125 is then subjected to chemical mechanical polishing (CMP) to produce a planar surface. A gate contact 127 and substrate contact 129, if required, are subsequently defined by suitable masking, etching and deposition techniques.

The ILD layer 123 shown in FIG. 3, and preferably also the ILD layer 125, are high compressive stress silicon nitride films which may be formed through the use of PECVD by the process which is described in greater detail below. This process can provide acceptable deposition rates (e.g., about 17 Å/sec), good Fourier Transform—Infrared (FT—IR) bonding profiles, and exceptional film stability and uniformity. Moreover, parts that incorporate films made by this process as an ILD layer may exhibit increased speed. In some applications, the ILD layers 123 and 125 may be formed as a single monolithic layer.

Figure 4:
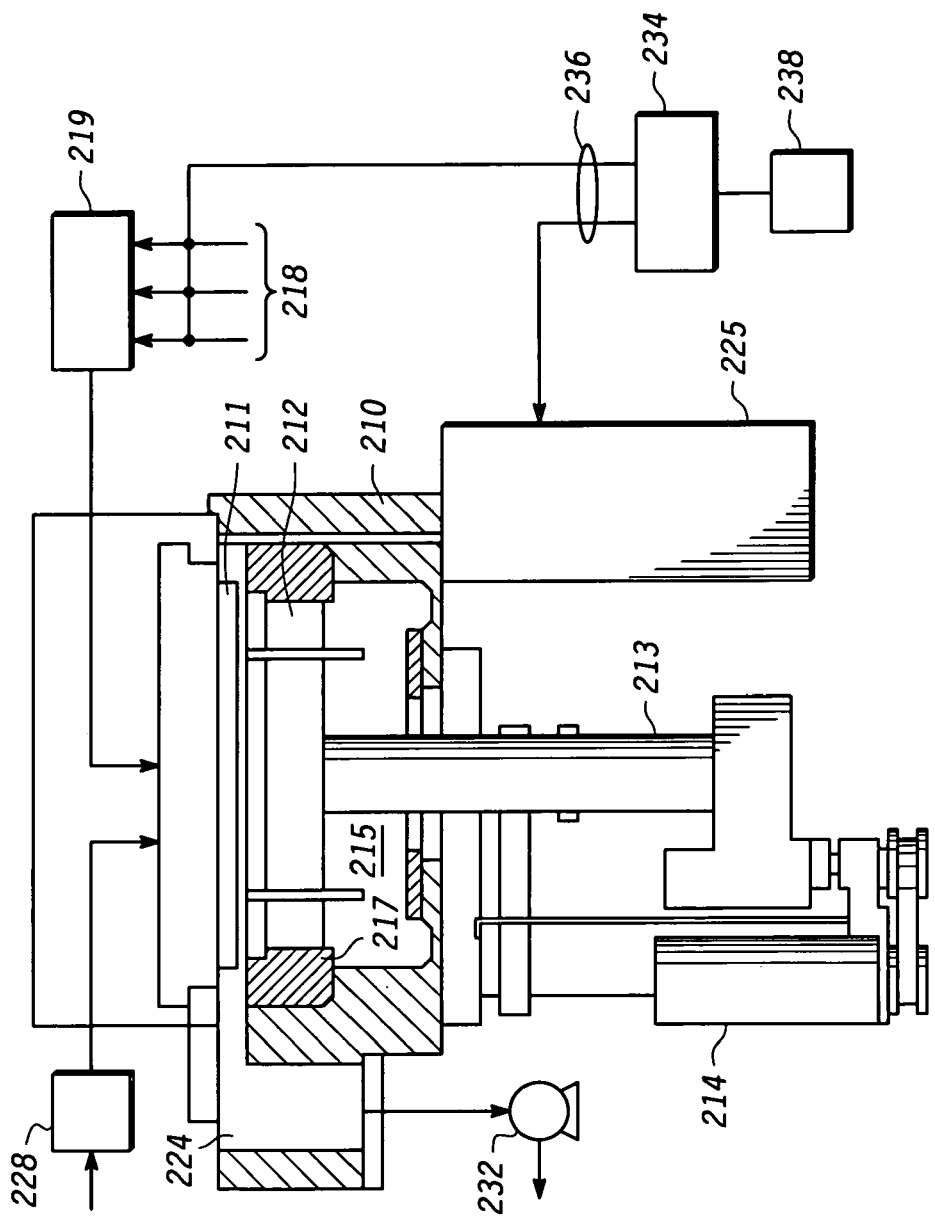
FIG. 4 is an illustration of a PECVD apparatus suitable for use in the methodologies disclosed herein.

A cross-sectional view of a PECVD reactor which is suitable for use in the methodologies described herein is depicted in FIG. 4. The particular reactor depicted is a parallel plate chemical vapor deposition reactor 210 having a high vacuum region 215. The reactor 210 contains a gas distribution manifold 211 for dispersing process gases through perforated holes in the manifold to a substrate or wafer (not shown) that rests on a substrate support plate or susceptor 212 which is raised or lowered by a lift motor 214. A liquid injection system (not shown) may also be provided for use in injecting a liquid reactant which reaches a gaseous state before entering the plasma region.

The reactor 210 is equipped with a heating means (not shown) for heating the process gases and substrate. The heating means may take the form, for example, of resistive heating coils or external lamps. The susceptor 212 is mounted on a support stem 213 so that the susceptor 212 (and the wafer supported on the upper surface of the susceptor 212) can be controllably moved between a lower loading/off-loading position and an upper processing position which is closely adjacent to the manifold 211.

When the susceptor 212 and the wafer are in processing position 214, they are surrounded by an insulator 217 and the process gases are exhausted into the manifold 224. During processing, gases inlet to the manifold 211 are uniformly distributed radially across the surface of the wafer. A vacuum pump 232 having a throttle valve controls the exhaust rate of gases from the chamber.

Before reaching manifold 211, deposition and carrier gases are input through gas lines 218 into a mixing system 219 where they are combined and then sent to the manifold 211. Generally, the process gas supply lines 218 for each of the process gases include (i) safety shut-off valves (not shown) that can be used to automatically or manually shut off the flow of the process gas into the chamber, and (ii) mass flow controllers (also not shown) that measure the flow of gas through the gas supply lines. When toxic gases are used in the process, several safety shut-off valves are typically positioned on each gas supply line in conventional configurations.

The deposition process performed in reactor 210 is a plasma enhanced process in which a controlled plasma is typically formed adjacent to the wafer by RF energy applied to the distribution manifold 211 from the RF power supply 225 (with susceptor 212 grounded). Alternatively, RF power can be provided to the susceptor 212 or RF power can be provided to different components at different frequencies. The RF power supply 225 can supply either single or mixed frequency RF power to enhance the decomposition of reactive species introduced into the high vacuum region 215. A mixed frequency RF power supply typically supplies power at a high RF frequency (RF1) of 13.56 MHz to the distribution manifold 211 and at a low RF frequency (RF2) of 360 KHz or the like to the susceptor 212.

Typically, any or all of the chamber lining, gas inlet manifold faceplate, support stem 213, and various other reactor hardware is made out of materials that are inert to the processing conditions. Such materials include aluminum and anodized aluminum.

The lift motor 214 raises and lowers susceptor 212 between a processing position and a lower, wafer-loading position. The motor, the gas mixing system 219, and the RF power supply 225 are controlled by a system controller 234 over control lines 236. The reactor includes analog assemblies, such as mass flow controllers (MFCs) and standard or pulsed RF generators, which are controlled by the system controller 234 which executes system control software stored on a hard disk or other suitable memory device 238. Motors and optical sensors are used to move and determine the position of movable mechanical assemblies such as the throttle valve of the vacuum pump 232 and the motor for positioning the susceptor 212.

The system controller 234 controls all of the activities of the CVD reactor and typically includes a disk drive and a card rack. The card rack contains a single board computer (SBC), analog and digital input/output boards, interface boards and stepper motor controller boards. The system controller 234 operates under the control of a computer program stored on the disk drive 238. The computer program dictates the timing, mixture of gases, RF power levels, susceptor position, and other parameters of a particular process.

The principles described herein will now be illustrated by the following non-limiting examples. In each of these examples, a PECVD reactor of the type depicted in FIG. 4 was utilized.

EXAMPLE 1

This example illustrates the chemistry for the atmosphere of a PECVD chamber that may be used to achieve high compressive stress silicon nitride films of the type described herein.

A PECVD reactor of the type depicted in FIG. 4 was used to deposit a silicon nitride film on a semiconductor wafer. The reactor conditions and chemistry are indicated in TABLE 1. As seen therein, prior to film deposition, a ramp up step was run for about 20 seconds utilizing a process gas stream of pure helium at 1500 sccm and at a pressure of 3 torr. Following this step, a set step was run for another 10 seconds and at a pressure of 3 torr. During the set step, the chemistry of the process gas stream was adjusted to the chemistry desired for the deposition process. The chemistry of the process gas stream for the set step and the subsequent deposition step consisted of He at 1400 sccm, $SiH_4$ at 20 sccm, $NH_3$ at 40 sccm, and $N_2$ at 1000 sccm for the particular PECVD reactor utilized and its current configuration. One skilled in the art will appreciate, however, that appropriate adjustments to these variables may need to be made to compensate for system differences.

Following the set step, a deposition step was run for 41.2 seconds at a pressure of 3 torr. During this step, the process gasses were preheated using a heater power of 300 mWatts. Also during this step, an RF plasma was generated using an RF power of 300 Watts. The plasma induced the decomposition of the $SiH_4$ and $NH_3$ precursor gasses, thus causing formation of a silicon nitride film whose stoichiometry is approximately $Si_3N_4$. Following the deposition step, the reaction chamber was pumped for a total of 15 seconds.

TABLE 1

Compressive Nitride Deposition Recipe

| | Ramp Up | Set | Deposition | Pump | Pump |
|---|---|---|---|---|---|
| Duration (seconds) | 20.0 | 10.0 | 41.2 | 5.0 | 10.0 |
| Pressure (Torr) | Servo 3.0 | Servo 3.0 | Servo 3.0 | Full Open | Full Open |
| RF Power (Watts) | 0 | 0 | 300 | 0 | 0 |
| Heater Temp. (° C.) | 430 | 430 | 430 | 430 | 430 |
| Preheat (mWatts) | 300 | 0 | 0 | 0 | 0 |
| Spacing (mils) | 300 | 300 | 300 | 300 | 300 |
| Gas flow (sccm) | He (750) | He (1400) $SiH_4$ (20) $NH_3$ (40) $N_2$ (1000) | He (1400) $SiH_4$ (20) $NH_3$ (40) $N_2$ (1000) | $SiH_4$ (−2) $SiH_4$ (−2) $NH_3$ (−2) $N_2$ (−2) | |

EXAMPLES 2–37

Following the same general approach set forth in EXAMPLE 1, a series of additional experiments were run in which the pressure in the PECVD chamber, the RF power applied to the plasma, the spacing between the upper electrode and the semiconductor substrate, the deposition time, the deposition rate, and the ratios of the process gasses were varied. The values of these parameters, and the results achieved, are set forth in TABLE 2. In this table, %u refers to the percent uniformity, which is a statistical measure of the variance in film thickness as measured at 9 different locations. RI refers to the refractive index of the film, which provides some indication of the compositional variation of the film from one experiment to the next. Delta stress from centerpoint refers to the difference between the stress observed in the film produced by the experiment to the stress observed in a film made under the conditions of EXAMPLE 1 (1.6 GPa).

TABLE 2

PECVD Chemistry (in SCCM) for Deposition if Silicon Nitride

| EXAMPLE | Pres. (Torr) | Power (Watts) | Spacing (mils) | Silane (sccm) | NH3 (sccm) | N2 (sccm) | He (sccm) | Dep. Time (sec.) | Avg. Thickness (Å) | Dep. Rate (Å/sec.) | % u | RI | Delta stress from centerpoint (MPa) |
|---|---|---|---|---|---|---|---|---|---|---|---|---|---|
| 2 | 3 | 300 | 300 | 40 | 80 | 2000 | 2800 | 200 | 3761 | 18.8 | 1.7 | 1.9054 | 0 |
| 3 | 2.5 | 200 | 290 | 25 | 60 | 1400 | 2950 | 200 | 1973 | 9.9 | 4.2 | 1.9064 | 40 |
| 4 | 2.5 | 200 | 290 | 25 | 100 | 2600 | 2000 | 200 | 2015 | 10.1 | 2.8 | 1.9146 | 159 |

TABLE 2-continued

PECVD Chemistry (in SCCM) for Deposition if Silicon Nitride

| EXAMPLE | Pres. (Torr) | Power (Watts) | Spacing (mils) | Silane (sccm) | NH3 (sccm) | N2 (sccm) | He (sccm) | Dep. Time (sec.) | Avg. Thickness (Å) | Dep. Rate (Å/sec.) | % u | RI | Delta stress from centerpoint (MPa) |
|---|---|---|---|---|---|---|---|---|---|---|---|---|---|
| 5  | 2.5 | 200 | 290 | 55 | 60  | 2600 | 2000 | 200 | 2985 | 14.9 | 5.8  | 1.9574 | 302 |
| 6  | 2.5 | 200 | 290 | 55 | 100 | 1400 | 2950 | 200 | 2868 | 14.3 | 2.6  | 1.9521 | 41  |
| 7  | 2.5 | 200 | 360 | 25 | 60  | 2600 | 2950 | 200 | 1934 | 9.7  | 0.9  | 1.9164 | 15  |
| 8  | 2.5 | 200 | 360 | 25 | 100 | 1400 | 2000 | 200 | 2139 | 10.7 | 1.0  | 1.9237 | 188 |
| 9  | 2.5 | 200 | 360 | 55 | 60  | 1400 | 2000 | 200 | 2848 | 14.2 | 4.1  | 1.9853 | 358 |
| 10 | 2.5 | 200 | 360 | 55 | 100 | 2600 | 2950 | 200 | 2670 | 13.4 | 1.9  | 1.9504 | 266 |
| 11 | 2.5 | 400 | 290 | 25 | 60  | 1400 | 2000 | 200 | 3139 | 15.7 | 2.5  | 1.8424 | 431 |
| 12 | 2.5 | 400 | 290 | 25 | 100 | 2600 | 2950 | 200 | 2959 | 14.8 | 2.0  | 1.8402 | 447 |
| 13 | 2.5 | 400 | 290 | 55 | 60  | 2600 | 2950 | 200 | 5306 | 26.5 | 2.5  | 1.9152 | 127 |
| 14 | 2.5 | 400 | 290 | 55 | 100 | 1400 | 2000 | 200 | 5377 | 26.9 | 2.8  | 1.9071 | 126 |
| 15 | 2.5 | 400 | 360 | 25 | 60  | 2600 | 2000 | 200 | 2764 | 13.8 | 3.1  | 1.8956 | 55  |
| 16 | 2.5 | 400 | 360 | 25 | 100 | 1400 | 2950 | 200 | 2424 | 12.1 | 11.3 | 1.9135 | 167 |
| 17 | 2.5 | 400 | 360 | 55 | 60  | 1400 | 2950 | 200 | 3815 | 19.1 | 52.6 | 1.9755 | 417 |
| 18 | 2.5 | 400 | 360 | 55 | 100 | 2600 | 2000 | 200 | 4276 | 21.4 | 41.1 | 1.7323 | 65  |
| 19 | 3.5 | 200 | 290 | 25 | 60  | 1400 | 2000 | 200 | 2397 | 12.0 | 3.1  | 1.9269 | 83  |
| 20 | 3.5 | 200 | 290 | 25 | 100 | 2600 | 2950 | 200 | 2183 | 10.9 | 2.2  | 1.9255 | 201 |
| 21 | 3.5 | 200 | 290 | 55 | 60  | 2600 | 2950 | 200 | 3305 | 16.5 | 5.4  | 1.9565 | 365 |
| 22 | 3.5 | 200 | 290 | 55 | 100 | 1400 | 2000 | 200 | 3514 | 17.6 | 4.8  | 1.9509 | 324 |
| 23 | 3.5 | 200 | 360 | 25 | 60  | 2600 | 2000 | 200 | 2438 | 12.2 | 2.1  | 1.9279 | 362 |
| 24 | 3.5 | 200 | 360 | 25 | 100 | 1400 | 2950 | 200 | 2315 | 11.6 | 1.0  | 1.9219 | 216 |
| 25 | 3.5 | 200 | 360 | 55 | 60  | 1400 | 2950 | 200 | 3132 | 15.7 | 4.9  | 1.9815 | 469 |
| 26 | 3.5 | 200 | 360 | 55 | 100 | 2600 | 2000 | 200 | 3516 | 17.6 | 4.7  | 1.9411 | 674 |
| 27 | 3.5 | 400 | 290 | 25 | 60  | 1400 | 2950 | 200 | 3198 | 16.0 | 2.9  | 1.8462 | 371 |
| 28 | 3.5 | 400 | 290 | 25 | 100 | 2600 | 2000 | 200 | 3312 | 16.6 | 2.1  | 1.8628 | 287 |
| 29 | 3.5 | 400 | 290 | 55 | 60  | 2600 | 2000 | 200 | 6041 | 30.2 | 2.7  | 1.9220 | 208 |
| 30 | 3.5 | 400 | 290 | 55 | 100 | 1400 | 2950 | 200 | 5716 | 28.6 | 1.8  | 1.9085 | 79  |
| 31 | 3.5 | 400 | 360 | 25 | 60  | 2600 | 2950 | 200 | 3024 | 15.1 | 1.9  | 1.8913 | 76  |
| 32 | 3.5 | 400 | 360 | 25 | 100 | 1400 | 2000 | 200 | 3105 | 15.5 | 1.8  | 1.9005 | 48  |
| 33 | 3.5 | 400 | 360 | 55 | 60  | 1400 | 2000 | 200 | 5350 | 26.8 | 6.0  | 1.9485 | 125 |
| 34 | 3.5 | 400 | 360 | 55 | 100 | 2600 | 2950 | 200 | 5014 | 25.1 | 3.1  | 1.9360 | 135 |
| 35 | 3.0 | 300 | 300 | 40 | 80  | 2000 | 2800 | 200 | 3774 | 18.9 | 1.6  | 1.9049 | −80 |
| 36 | 3.0 | 300 | 300 | 40 | 80  | 2000 | 2800 | 200 | 3750 | 18.8 | 1.7  | 1.9095 | 15  |
| 37 | 3.0 | 300 | 300 | 40 | 80  | 2000 | 2800 | 200 | 3724 | 18.6 | 1.5  | 1.9110 | 7   |

FIGS. 5–11 graphically depict some of the results from TABLE 2. These graphs were generated using the JMP 5.1 software package which is available commercially from SAS, Inc., Cary, N.C.

Figure 5:
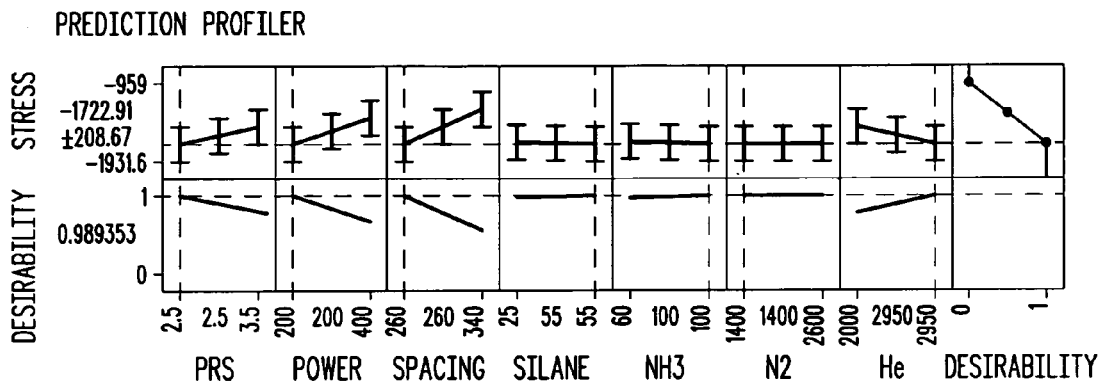
FIG. 5 is a graph illustrating the predicted effect of a variety of parameters on stress for three different temperature conditions.

With reference to FIG. 5, the intersection of the dashed lines indicates the maximum value with relation to stress [that is, the point where the compressive stress maximum occurs] for each of the variables. As seen from FIG. 5, within the range of variables measured, compressive stress of the silicon nitride film decreases with increasing pressure within the PECVD chamber (measured in Torr), and also decreases with increasing RF power (measured in Watts) and spacing (measured as the distance between the wafer and the upper electrode in the PECVD chamber). On the other hand, compressive stress increases slightly with the flow rate of helium, but is largely unaffected by the flow rate of silane, nitrogen, and ammonia.

Figure 6:
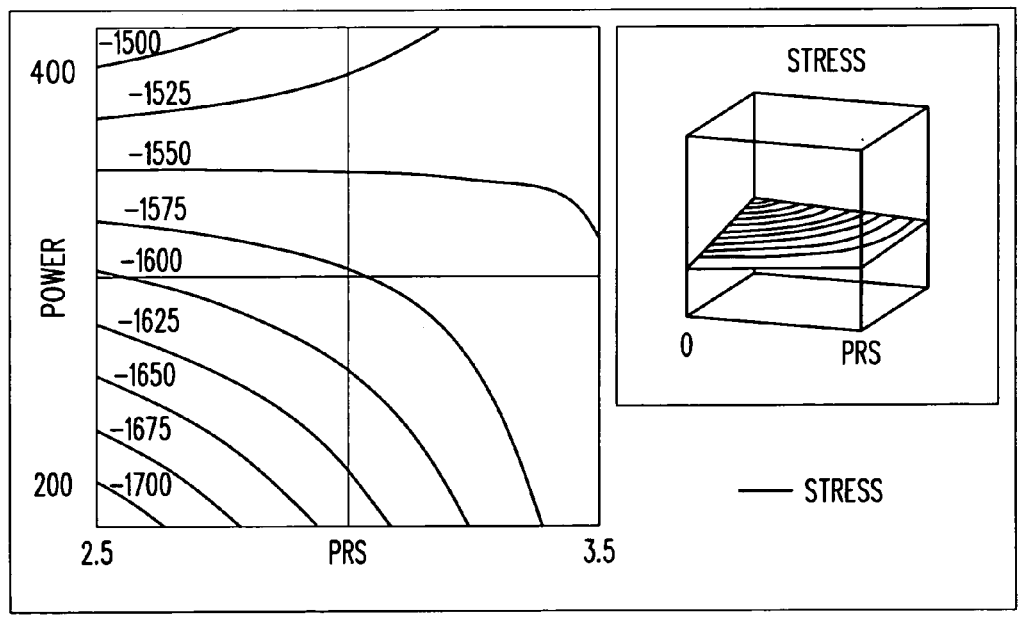
FIG. 6 is a contour plot depicting predicted isobars of compressive stress for varying RF power and pressure.
Figure 7:
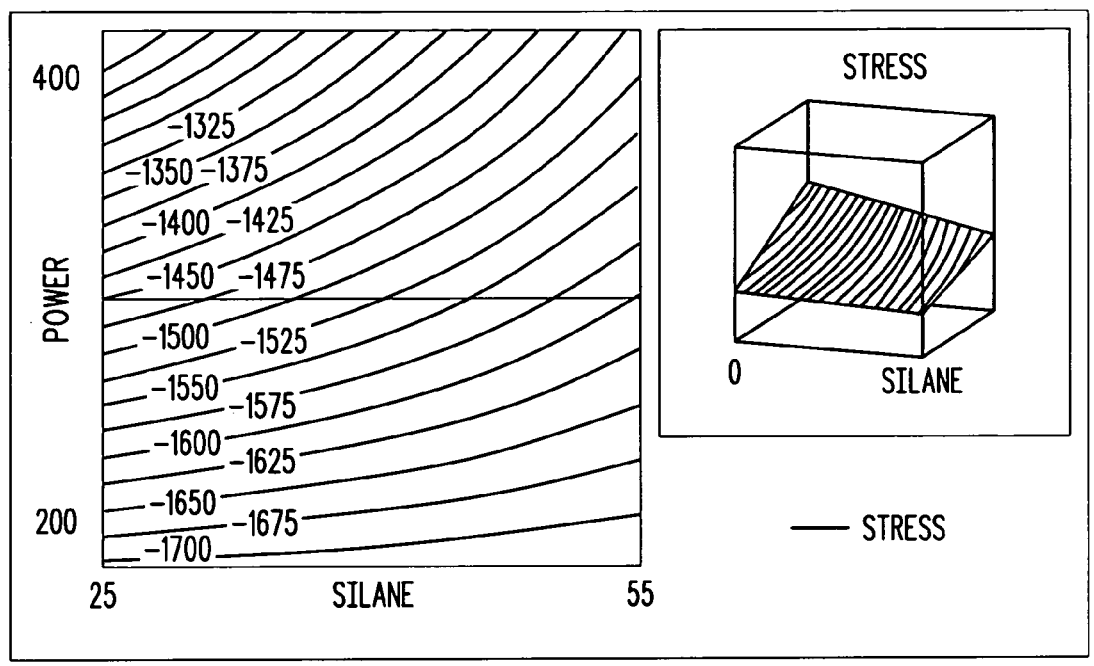
FIG. 7 is a contour plot depicting predicted isobars of compressive stress for varying RF power and flow rate of silane.
Figure 8:
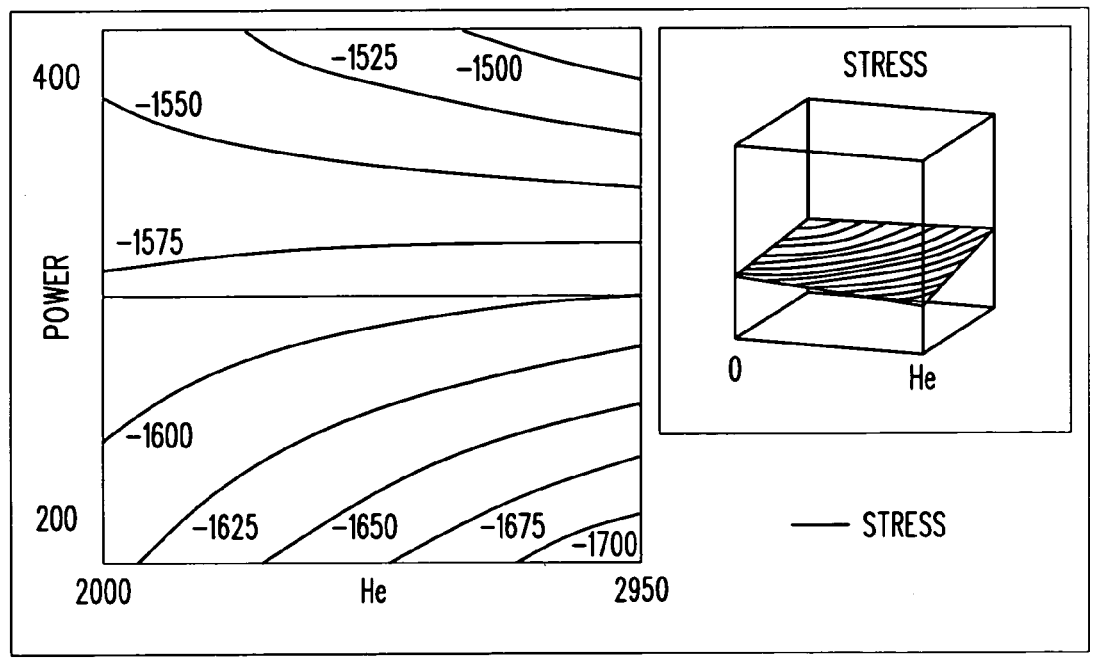
FIG. 8 is a contour plot depicting predicted isobars of compressive stress for varying RF power and flow rate of helium.
Figure 9:
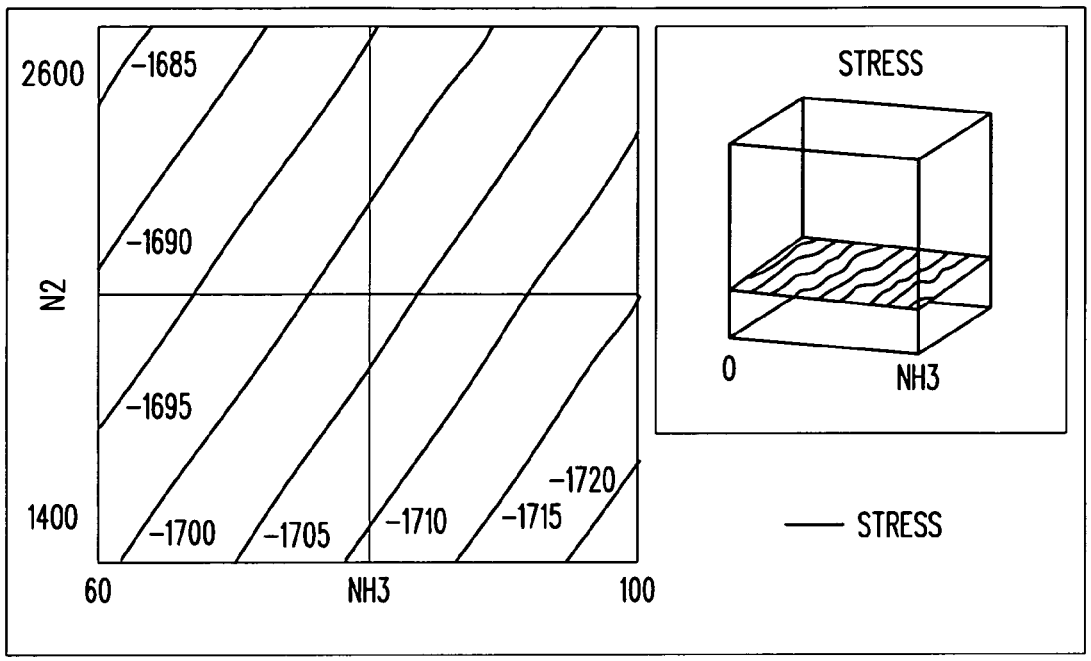
FIG. 9 is a contour plot depicting predicted isobars of compressive stress for varying flow rates of nitrogen and ammonia.
Figure 10:
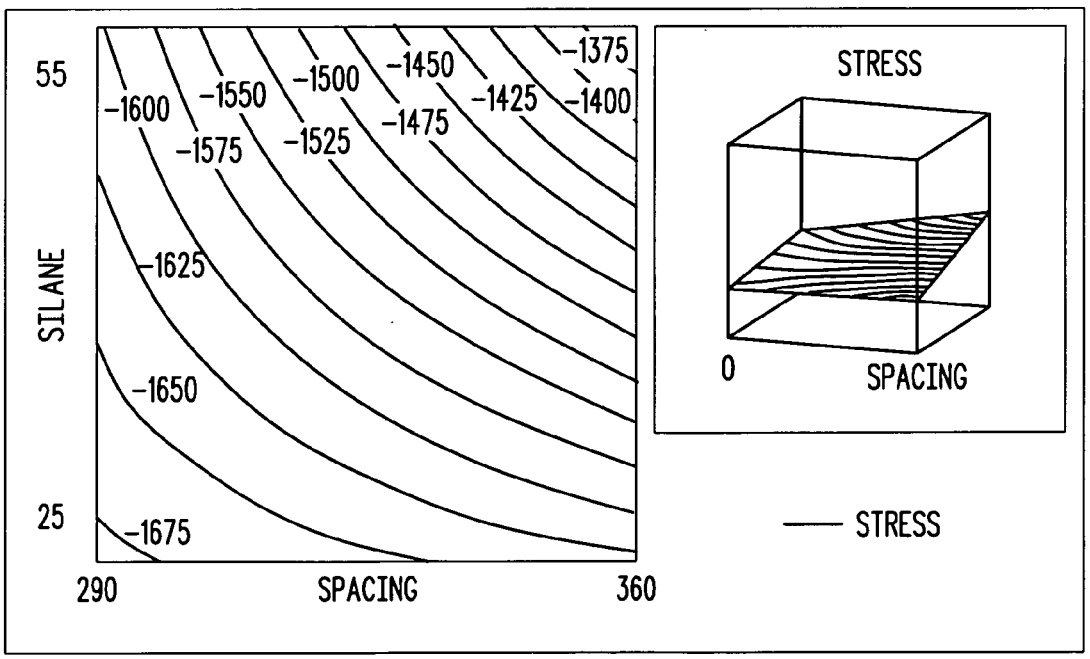
FIG. 10 is a contour plot depicting predicted isobars of compressive stress for varying flow rate of silane and spacing between the wafer substrate and the RF plasma generator.

FIGS. 6–10 are contour plots based on the data in TABLE 2 for different levels of compressive stress as a function of RF power, pressure, spacing, and flow rate of helium, nitrogen, ammonia, and silane. As the results indicate, some of the process parameters must be fairly tightly controlled (that is, kept within a relatively narrow range) to achieve the optimum compressive stress values. Thus, for example, FIG. 6 shows that the maximum compressive stress of 1.7 GPa shown therein was obtained within a fairly narrow range of power and pressure. Similar results are seen in FIG. 8 for RF power and He flow rate. On the other hand, FIG. 7 shows that the maximum stress was obtained over a broad range of silane flow (thus indicating that the stress maximum is largely unaffected by silane flow rate), but was obtained over a fairly narrow range of RF power (note the significant drop-off in stress as RF power increases). FIG. 9 shows that compressive stress of the silicon nitride film varies only slightly over the entire range of $N_2$ and $NH_3$ flow rates, thus indicating that the stress maximum is largely unaffected by these variables. FIG. 10 shows that compressive stress is significantly affected by the spacing between the wafer substrate and the upper RF electrode in the PECVD chamber, but is largely unaffected by silane flow rate.

Figure 11:
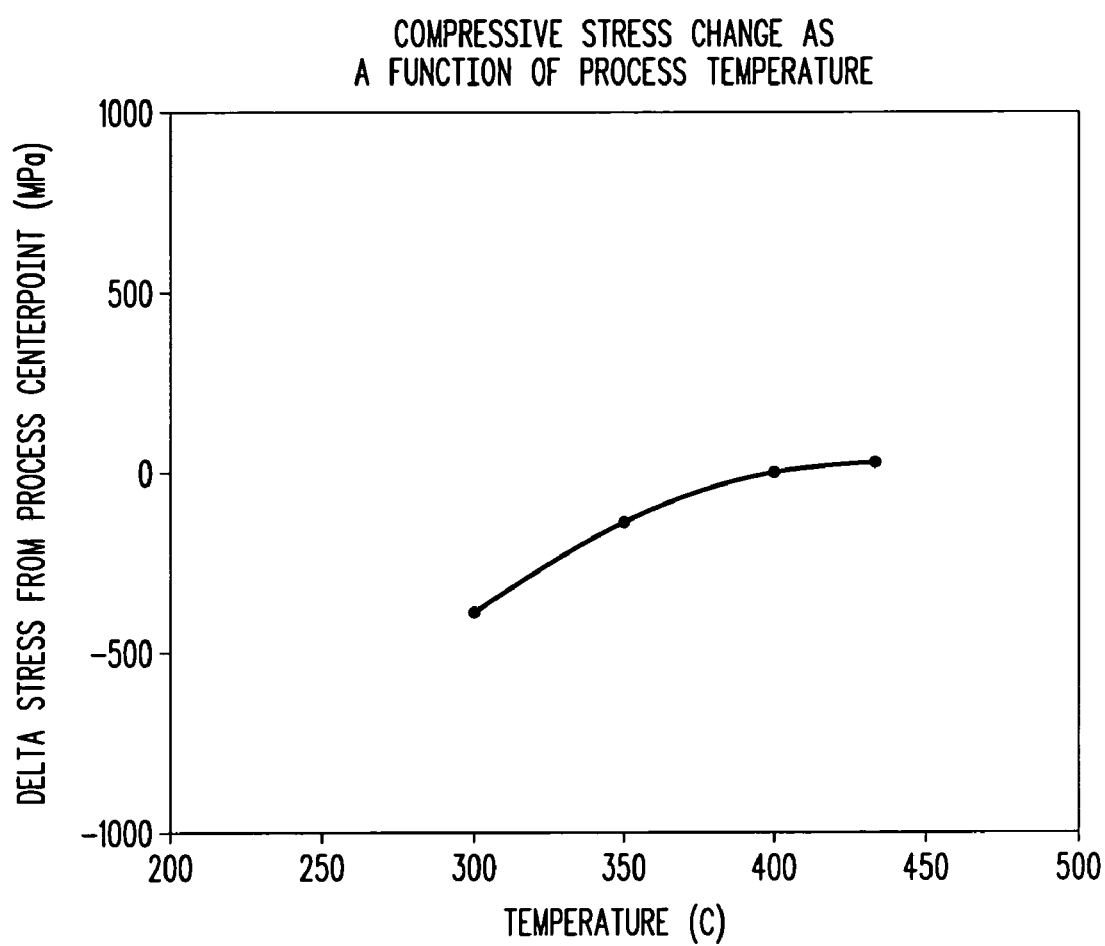
FIG. 11 is a contour plot of the change in compressive stress from the process centerpoint as a function of process temperature.

FIG. 11 illustrates the change in stress from the process centerpoint as a function of temperature. As shown therein, compressive stress drops off steeply as temperature is reduced below about 400° C.

Various processing temperatures may be used in the PECVD process described herein. Typically, the processing temperature is greater than 300° C. since, as indicated in FIG. 11, the compressive stress of the silicon nitride film is significantly compromised below these temperatures. Preferably, the processing temperature is greater than 350° C., more preferably, the processing temperature is within the range of 350° C. to 450° C., and most preferably, the processing temperature is within the range of 400° C. to 450° C.

The atmosphere within the PECVD chamber may vary within certain ranges. As previously noted, the atmosphere preferably contains He, $N_2$, $NH_3$ and $SiH_4$ during deposition of the silicon nitride film, with the flow rate of He being particularly important. The typical, preferred, more preferred, and most preferred flow rates of these gases are indicated in TABLE 3.

TABLE 3

PECVD Chemistry (in SCCM) for Deposition if Silicon Nitride

| Gas | Typical | Preferred | More Preferred | Most Preferred |
|---|---|---|---|---|
| Silane ($SiH_4$) | 5–55 | 10–40 | 15–35 | 20–30 |
| Nitrogen ($N_2$) | 200–2600 | 800–2000 | 1100–1700 | 1200–1600 |
| Helium (He) | 2000–4000 | 2500–3500 | 2700–3300 | 2800–3200 |
| Ammonia ($NH_3$) | 60–140 | 80–120 | 90–110 | 95–105 |

As previously noted, the process gas stream used for forming ILDs in accordance with the teachings herein contains helium. The relative amount of helium utilized may be described in various ways. Typically, the ratio of the flow rate of helium to the flow rate of silane is at least 15, and preferably, the ratio of the flow rate of helium to the flow rate of silane is within the range of about 35 to about 140. More preferably, the ratio of the flow rate of helium to the flow rate of silane is within the range of about 40 to about 100, and most preferably, the ratio of the flow rate of helium to the flow rate of silane is within the range of about 60 to about 80. The ratio of the combined flow rates of helium and nitrogen to the flow rate of silane is preferably at least 30, more preferably within the range of about 80 to about 160, and most preferably within the range of about 100 to about 140.

The pressure in the PECVD chamber used for forming ILDs in accordance with the teachings herein is typically maintained at less than 4 Torr during the film deposition process, and is preferably maintained within the range of about 0.5 to about 3.5 Torr during this process. More preferably, the pressure in the PECVD chamber during ILD deposition is maintained within the range of about 1.5 to about 3.5 Torr, and most preferably the pressure is maintained within the range of about 2 to about 3 Torr.

The RF power of the plasma generator in the PECVD chamber used for forming ILDs in accordance with the teachings herein is typically maintained at less than 400 Watts, and is preferably maintained within the range of about 100 to about 300 Watts. More preferably, the power is maintained within the range of about 150 to about 250 Watts, and most preferably, the power is maintained within the range of about 175 to about 225 Watts.

The spacing between the wafer and the upper electrode in the PECVD chamber is typically less than 340 mils, and is preferably within the range of about 180 mils to 340 mils. More preferably, the spacing is within the range of about 220 mils to 300 mils, and most preferably, the spacing is within the range of about 240 mils to 280 mils.

A method has been provided herein for making silicon nitride films with high compressive stress through a PECVD process by the addition of helium to the deposition chemistry, and by maintaining, within suitable ranges, the pressure, RF power, and spacing between the substrate and upper electrode. The resulting process can provide acceptable deposition rates (e.g., deposition rates of about 17 Å/sec), good Fourier Transform—Infrared (FT-IR) bonding profiles, and exceptional film stability and uniformity, and the incorporation of ILD films made by this process into a transistor can result in increased speed in the transistor.

A method for forming a semiconductor device has also been provided herein. In accordance with the method, a substrate is provided, and a dielectric material is formed on the substrate through plasma enhanced chemical vapor deposition (PECVD). The PECVD is conducted at a temperature of greater than 300° C., and utilizes an atmosphere comprising nitrogen, silane, ammonia, and helium.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a substrate; and
   forming a dielectric material on the substrate through plasma enhanced chemical vapor deposition (PECVD), wherein the PECVD is conducted at a temperature greater than 300° C. and utilizes an atmosphere comprising nitrogen, silane, ammonia, and helium, and wherein the dielectric material comprises silicon nitride.

2. The method of claim 1, wherein the PECVD is conducted at a temperature of at least 400° C.

3. The method of claim 1, wherein the PECVD is conducted at a temperature within the range of about 400° C. to about 450° C.

4. The method of claim 1, wherein the atmosphere is achieved with a source of helium having a flow rate of helium associated therewith, and a source of silane having a flow rate of silane associated therewith, and wherein the ratio of the flow rate of helium to the flow rate of silane is at least 15.

5. The method of claim 4, wherein the ratio of the flow rate of helium to the flow rate of silane is within the range of about 35 to about 140.

6. The method of claim 1, further comprising the step of incorporating the dielectric material and substrate into a CMOS device.

7. The method of claim 1, wherein the substrate comprises a first metal layer, and further comprising the step of disposing a second metal layer such that the dielectric material is disposed between the first and second metal layer.

8. The method of claim 1, wherein the PECVD is conducted within a chamber having first and second electrodes, wherein the substrate is disposed between the first and second electrodes, and wherein the spacing between the substrate and the first electrode is within the range of about 180 mils to 340 mils.

9. The method of claim 8, wherein the spacing between the substrate and the first electrode is within the range of about 220 mils to 300 mils.

10. The method of claim 8, wherein the spacing between the substrate and the first electrode is within the range of about 240 mils to 280 mils.

11. The method of claim 1, wherein the PECVD is conducted within a chamber having first and second electrodes, wherein the substrate is disposed between the first and second electrodes, wherein the first electrode is an RE electrode, and wherein the power supplied to the first electrode is within the range of about 100 to about 300 mWatts.

12. The method of claim 11, wherein the power supplied to the first electrode is within the range of about 150 to about 250 mWatts.

13. The method of claim 11, wherein the power supplied to the first electrode is within the range of about 175 to about 225 mWatts.

14. The method of claim 1, wherein the PECVD is conducted within a chamber having a pressure maintained within the range of about 0.5 to about 3.5 torr.

15. The method of claim 1, wherein the PECVD is conducted within a chamber having a pressure maintained within the range of about 2 to about 3 torr.

16. The method of claim 1, wherein the dielectric material is an interlayer dielectric (ILD).

17. The method of claim 16, wherein the ILD has a compressive stress of at least about 1 GPa.

18. The method of claim 16, wherein the ILD has a compressive stress of at least about 1.7 GPa.

19. The method of claim 16, wherein the ILD has a compressive stress of at least about 2.0 GPa.

20. The method of claim 1, wherein the atmosphere is achieved using:
    a flow rate of silane within the range of about 5 to about 55 sccm;
    a flow rate of nitrogen within the range of about 200 to about 2600 sccm;
    a flow rate of helium within the range of about 2000 to about 4000 sccm; and
    a flow rate of ammonia within the range of about 60 to about 140 sccm.

21. The method of claim 1, wherein the atmosphere is achieved using:
    a flow rate of silane within the range of about 10 to about 40 sccm;
    a flow rate of nitrogen within the range of about 800 to about 2000 sccm;
    a flow rate of helium within the range of about 2500 to about 3500 sccm; and
    a flow rate of ammonia within the range of about 80 to about 120 sccm.

22. The method of claim 1, wherein the atmosphere is achieved using:
    a flow rate of silane within the range of about 15 to about 35 sccm;
    a flow rate of nitrogen within the range of about 1100 to about 1700 sccm;
    a flow rate of helium within the range of about 2700 to about 3300 sccm; and
    a flow rate of ammonia within the range of about 90 to about 110 sccm.

23. The method of claim 1, wherein the atmosphere is achieved using:
    a flow rate of silane within the range of about 20 to about 30 sccm;
    a flow rate of nitrogen within the range of about 1200 to about 1600 sccm;
    a flow rate of helium within the range of about 2800 to about 3200 sccm; and
    a flow rate of ammonia within the range of about 95 to about 105 sccm.

* * * * *

UNITED STATES PATENT AND TRADEMARK OFFICE
CERTIFICATE OF CORRECTION

PATENT NO. : 7,192,855 B2 Page 1 of 1
APPLICATION NO. : 11/106970
DATED : March 20, 2007
INVENTOR(S) : Stan Filipiak It is certified that error appears in the above-identified patent and that said Letters Patent is hereby corrected as shown below:

<u>In the Claims</u>

In Claim 11, Col. 11, line 10, please delete "RE" and insert therefore -- RF --.

Signed and Sealed this

Fifth Day of June, 2007

JON W. DUDAS
*Director of the United States Patent and Trademark Office*